(12) United States Patent
Reinmuth

(10) Patent No.: US 10,060,944 B2
(45) Date of Patent: Aug. 28, 2018

(54) MICROMECHANICAL SENSOR DEVICE AND CORRESPONDING MANUFACTURING METHOD

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 236 days.

(21) Appl. No.: 14/931,069

(22) Filed: Nov. 3, 2015

(65) Prior Publication Data

US 2016/0146850 A1 May 26, 2016

(30) Foreign Application Priority Data

Nov. 24, 2014 (DE) .................. 10 2014 223 850

(51) Int. Cl.
*G01P 15/125* (2006.01)
*G01P 15/08* (2006.01)
(52) U.S. Cl.
CPC ........ *G01P 15/125* (2013.01); *G01P 15/0802* (2013.01); *H01L 2224/11* (2013.01)
(58) Field of Classification Search
CPC .......................... G01P 15/125; G01P 15/0802
See application file for complete search history.

(56) References Cited

U.S. PATENT DOCUMENTS

| 9,096,421 B2* | 8/2015 | Ziglioli ................ B81C 1/0023 |
| 2012/0049299 A1 | 3/2012 | Chou |
| 2012/0109102 A1 | 5/2012 | Vandewalle |

* cited by examiner

*Primary Examiner* — David M Gray
*Assistant Examiner* — Andrew V Do
(74) *Attorney, Agent, or Firm* — Norton Rose Fulbright US LLP; Gerard Messina

(57) ABSTRACT

A micromechanical sensor device, and a corresponding method, including an ASIC substrate having first front and rear sides, a first rewiring element on the first front side; a MEMS substrate having a second front side, and a second rear side having a base substrate and a second rewiring element formed thereon; a micromechanical functional layer having at least one movable sensor structure, and which is on the second front side of the second rewiring element; a capping element having third front and rear sides, the third rear side being applied to the second front side for capping the sensor structure; and a recess formed in the base substrate on the second rear side, or in the capping element on the third front side, and within which the ASIC substrate is suspended on a flexible layered first suspension element via the first rewiring element, forming a cavity surrounding the ASIC chip.

11 Claims, 11 Drawing Sheets

MICROMECHANICAL SENSOR DEVICE AND CORRESPONDING MANUFACTURING METHOD

RELATED APPLICATION INFORMATION

The present application claims priority to and the benefit of German patent application no. 10 2014 223 850.1, which was filed in Germany on Nov. 24, 2014, the disclosure of which is incorporated herein by reference.

FIELD OF THE INVENTION

The present invention relates to a micromechanical sensor device and a corresponding manufacturing method.

BACKGROUND INFORMATION

Although any micromechanical components are applicable, the present invention and its underlying object to be achieved are explained with reference to components which include inertial sensors based on silicon.

Micromechanical sensor devices for measuring acceleration, rotation rate, magnetic field, and pressure, for example, are generally known, and are mass-produced for various applications in the automotive and consumer sectors. In particular the miniaturization of components, functional integration, and effective cost reduction are trends in consumer electronics.

Nowadays, acceleration sensors and rotation rate sensors, as well as acceleration sensors and magnetic field sensors, are already manufactured as combination sensors (6d), and in addition there are first 9d modules, in which in each case 3-axis acceleration sensors, rotation rate sensors, and magnetic field sensors are combined into a single sensor device.

If, for example, small, inexpensive combinations of rotation rate sensors and acceleration sensors are to be manufactured, this may be carried out by providing a rotation rate sensor and an acceleration sensor on one chip. Both sensors may thus be produced on one substrate at the same time. The sensors are encapsulated on the substrate level via a cap wafer which provides two cavities per chip. In addition, different pressures may be set in the two cavities via an additional getter layer, so that each individual sensor has the optimal working pressure. A cost-effective product may be manufactured due to the fact that a very large number of sensors may be produced on one substrate at the same time.

To be able to install the sensor as a component on a circuit board, a sensor of this type together with an evaluation ASIC is glued to a carrier substrate, and contact is established between the sensor chip and the evaluation ASIC chip on the one hand and between the evaluation ASIC chip and the carrier substrate on the other hand. Solder balls are situated on the bottom side of the carrier substrate, with which the component is soldered and thus electrically connected to a circuit board. Lastly, the evaluation ASIC chip and the sensor chip are overmolded with a molding compound.

This method, in particular manufacturing the component from individual elements, is relatively complicated and expensive as a single process. In addition, the molding compound and the carrier substrate are required. Furthermore, only relatively large components may be manufactured.

In addition, manufacturing methods for rotation rate sensors and acceleration sensors which include an integrated CMOS evaluation circuit are known. For example, a structured oxide layer to which a monocrystalline functional layer 11 is bonded is provided on a CMOS wafer. An electrical connection between the functional layer and the CMOS evaluation circuit is established via a trenching process and filling with a conductive material. Via a further separation step, the functional layer is structured and self-supporting MEMS structures are produced, whose motion may then be easily capacitively excited or detected, for example. The functional layer is subsequently hermetically sealed with a cap wafer. Depending on the application, a suitable pressure is enclosed within the sealed volume. Contact areas for the CMOS wafer are exposed in order to relay the output signal of the ASIC chip via bonding wires and a suitable housing, as discusses in US 2010/0109102 A1, for example.

If very small sensors are to be manufactured, a housing may be dispensed with, and the combined ASIC-MEMS chip may be soldered directly to a circuit board, which is also referred to as a "bare die" system. However, to provide for direct solderability, the output signal of the ASIC chip must be led through the ASIC wafer to the rear side of the ASIC wafer through a via. A rewiring level is customarily provided there in order to then transmit the ASIC signal to the circuit board via solder balls, which are likewise provided on the rear side, as known from US 2012/0049299 A1, for example.

Via techniques in ASIC applications are expensive, and may generally be used only for very thin substrates. Thus far, via techniques for ASICs, due to other electrical requirements, have also not been developed as extensively as via techniques for capacitive MEMS signals. Consequently, the manufacturing costs as well as the failure rate in vias of ASICs are very high.

In addition, no ASIC circuit may be situated at locations where the vias are provided, resulting in additional surface area, and thus additional costs, for the ASIC chip. The self-supporting MEMS structures are anchored on the ASIC wafer. Since the ASIC wafer is very thin, and no intermediate substrate is present for stress decoupling, external stresses, for example mechanical stresses, may be caused by different coefficients of expansion of the circuit board and of the ASIC wafer, which easily bend the MEMS structures, which then results in error signals in the sensor.

In addition, these types of systems are difficult to test in comparison to discrete systems. In discrete systems, the discrete MEMS sensor as well as the evaluation ASIC may be tested before they are joined as a component. During an integration on the wafer level, it is possibly to test only the entire system, and also only after the vias of the ASIC have been provided. Therefore, the system is testable only at a very late stage, thus entailing numerous manufacturing risks. In addition, the testing depth is smaller, since some primary MEMS sensor parameters cannot be tested via the evaluation ASIC.

SUMMARY OF THE INVENTION

The present invention provides a micromechanical sensor device according to the description herein and a corresponding manufacturing method according to the description herein.

Refinements are the subject matter of the respective further descriptions herein.

According to the present invention, a micromechanical sensor device having a robust bare die design without stress sensitivity may be manufactured. Most of the manufacturing steps may take place on the wafer level in order to obtain a cost-effective approach. The vias of the ASIC substrate, which are critical with regard to cost and quality, may be dispensed with. Testability of the single elements, namely, the MEMS substrate and the ASIC substrate, is provided. An expensive intermediate substrate as well as molding compound may be dispensed with. The component according to the present invention may thus have an extremely compact design.

The concept underlying the present invention is that a recess is provided in the base substrate, in the capping element, or in both, and the ASIC substrate is suspended in same via a flexible layered suspension element. The ASIC substrate may thus be elastically suspended, decoupled from stress. Additional suspension areas may be provided in the cavity surrounding the ASIC substrate, for example to provide only a partially flexible suspension. In this way, even two ASIC substrates may be integrated if desired, one in the base substrate and another in the capping element.

The electrical connection between the MEMS substrate and the ASIC substrate may take place through a via in the MEMS substrate or in the capping element, and with the aid of a conductor element which extends across the flexible connecting area between the MEMS substrate and the ASIC substrate. The connection of the micromechanical sensor device according to the present invention may take place solely via contact points, in particular solder balls, which are connected exclusively to the ASIC substrate.

During the manufacture on the wafer level, initially the capped MEMS components, which are electrically testable on the wafer level, are produced. The recesses are then provided, and individual ASIC substrates may be suspended therein via a respective flexible suspension. The individual ASIC substrates may thus be electrically tested beforehand, and defective components may be sorted out.

An electrical connection between the via may be integrated into the flexible suspension element. Electrical testing of the combined micromechanical sensor device may be carried out after the mechanical and electrical connection of the MEMS substrate and the ASIC substrate. Solder balls are subsequently formed on the ASIC substrate, after which the sensor elements may be separated.

According to another refinement, the recess is formed in the base substrate, the first suspension element being anchored on the second rear side.

According to another refinement, the recess is formed in the capping element, the first suspension element being anchored on the third front side.

According to another refinement, the first suspension element has multiple flexible layers, which may be polyimide layers, and a conductor element embedded therein which is electrically connected to the first rewiring element. This makes a particularly flexible suspension possible.

According to another refinement, the conductor element has a meandering configuration in a peripheral area of the ASIC substrate. This protects the conductor element from damage under stress-related loads.

According to another refinement, the conductor element is electrically connected to the micromechanical functional layer through a via formed in the base substrate or in the capping element. This makes a via in the ASIC substrate unnecessary.

According to another refinement, a second suspension element is formed in the cavity. This increases the stability without taking away the flexibility.

According to another refinement, the second suspension element has at least one island-shaped rigid or flexible adhesion area. This simplifies the manufacture.

According to another refinement, the first suspension element is anchored, via an insulating layer, on the second rear side, which closes off a through opening which leads to an additional cavity in which the movable sensor structure is formed. The additional cavity may thus be conditioned from the second rear side after the cap is applied.

According to another refinement, bond connections for electrically connecting the sensor device are formed on the first suspension element in the area of the first front side. This allows for simple installation and connection.

Further features and advantages of the present invention are explained below based on specific embodiments, with reference to the figures.

DETAILED DESCRIPTION

Figure 1:
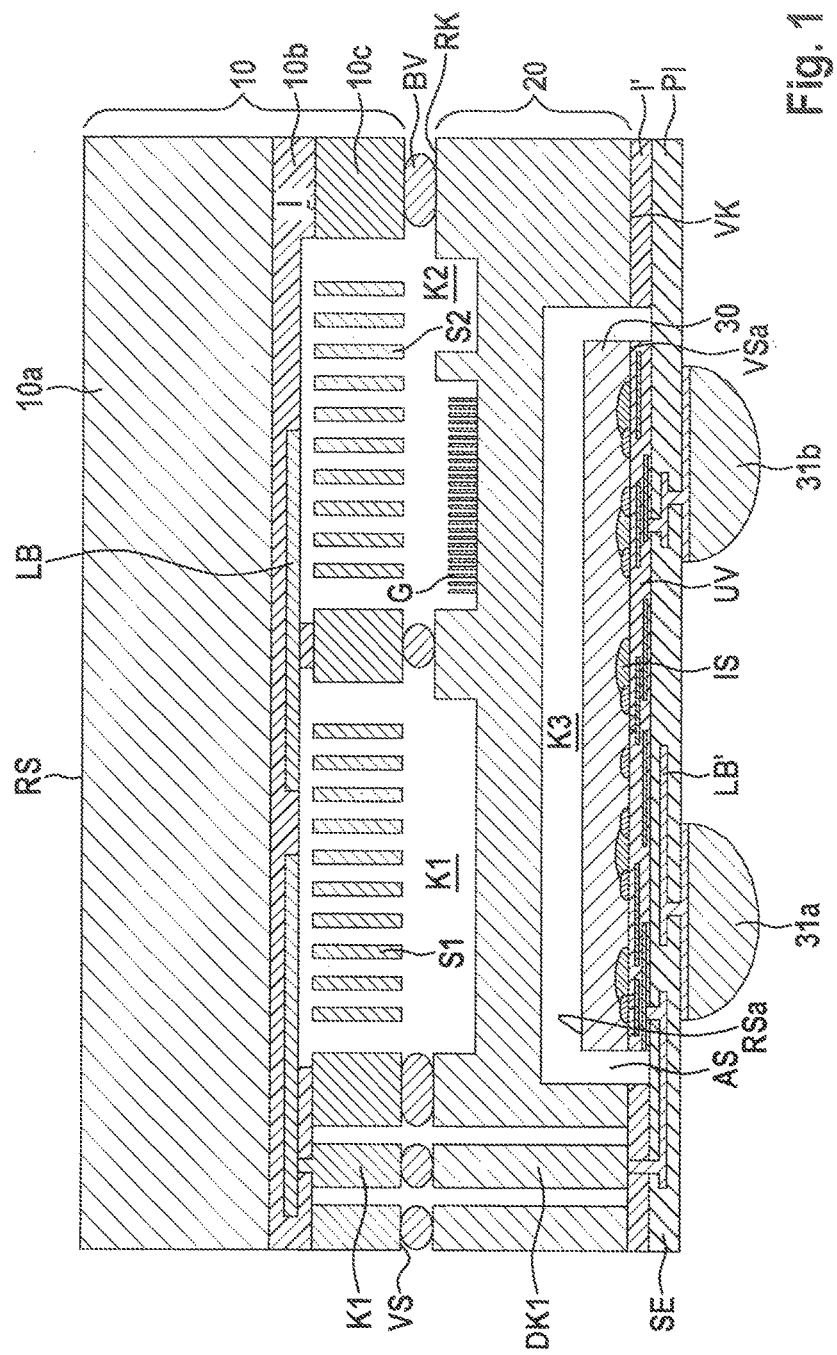
FIG. 1 shows a schematic cross-sectional view for explaining a micromechanical sensor device according to a first specific embodiment of the present invention.

Identical or functionally equivalent elements are denoted by the same reference numerals in the figures.

FIG. 1 shows a schematic cross-sectional view for explaining a micromechanical sensor device according to a first specific embodiment of the present invention.

In FIG. 1, reference numeral 30 denotes an ASIC substrate having a first front side VSa and a first rear side RSa, a first rewiring element UV which includes a plurality of conductor levels and insulating layers being formed on first front side VSa, the insulating layers insulating the conductor levels from one another and from the surroundings. Electrical signals of integrated circuits IS housed in ASIC substrate 30 may be conducted to the outside via first rewiring element UV.

Reference numeral 10 denotes a MEMS substrate having a second front side VS, and a second rear side RS which includes a base substrate 10a on which a second rewiring element 10b is formed. Second rewiring element 10b likewise includes conductors LB, which are embedded in insulating layers I.

A micromechanical functional layer 10c made of polysilicon, for example, is formed on second front side VS of second rewiring element 10b; two movable sensor structures S1, S2 which are hermetically packaged under a predetermined atmosphere in a first and second cavity K1, K2, respectively, are formed in the micromechanical functional layer. First sensor structure S1 is an acceleration sensor structure, and second sensor structure S2 is a rotation rate sensor structure. Since the two sensor structures S1, S2 require different working pressures, a getter layer G is additionally introduced into second cavity K2.

A capping element 20 having a third front side VK and a third rear side RK is bonded to micromechanical functional layer 10c via a bond connection BV in such a way that cavities K1, K2 are hermetically sealed and separated from one another.

A recess AS in capping element 20 is provided on third front side VK. Within recess AS, ASIC substrate 30 is suspended on a flexible layered first suspension element SE via first rewiring element UV, forming a cavity K3 which surrounds ASIC chip 30 at the sides and rear.

First suspension element SE is anchored on third front side VK via an insulating layer I', for example an oxide layer, situated in between. First suspension element SE includes a plurality of polyimide layers PI and conductor elements LB' embedded therein or applied thereto. Solder balls 31a, 31b are connected to conductor element LB' in the area of first front side VSa and rewiring element UV.

Over the flexible areas of first suspension element SE which extend across the circumferential gap in the peripheral area of ASIC wafer 30 formed by cavity K3, conductor element LB' may have a meandering design in the plane extending perpendicularly to the illustration, so that deformations of first suspension element SE which occur under stress are not able to cause damage to conductor element LB'.

At third front side VK, conductor element LB' is electrically connected to a via DK1 led through capping element 20, and is also electrically connected to second rewiring element 10b via a contact area K1 of micromechanical functional layer 10c, so that electrical signals from first rewiring element 10b may reach conductor element LB' via contact area K1 in micromechanical functional layer 10c through via DK1, and from there may reach solder balls 31a, 31b. Via DK1 may be surrounded by a gap which may be filled with air or an insulating material.

As the result of the rewiring element of ASIC substrate 30 facing outwardly, i.e., toward third front side VK, the wiring may have a simple design, thus making it possible for solder balls 31a, 31b to be provided solely in the area of ASIC substrate 30 above first rewiring element UV. With an appropriate selection of the thickness of insulating layer I', for example the same thickness as first rewiring element UV, first front side VSa is thus in flush alignment in a plane with third front side VK.

Polyimide, i.e., a fluorine-containing compound, may be used as insulating material for layer material of first suspension element SE, although other materials having favorable elastic properties are also conceivable. Copper (Cu) or aluminum (Al) may be used as conductor material for material of conductor element LB'.

Figure 2:
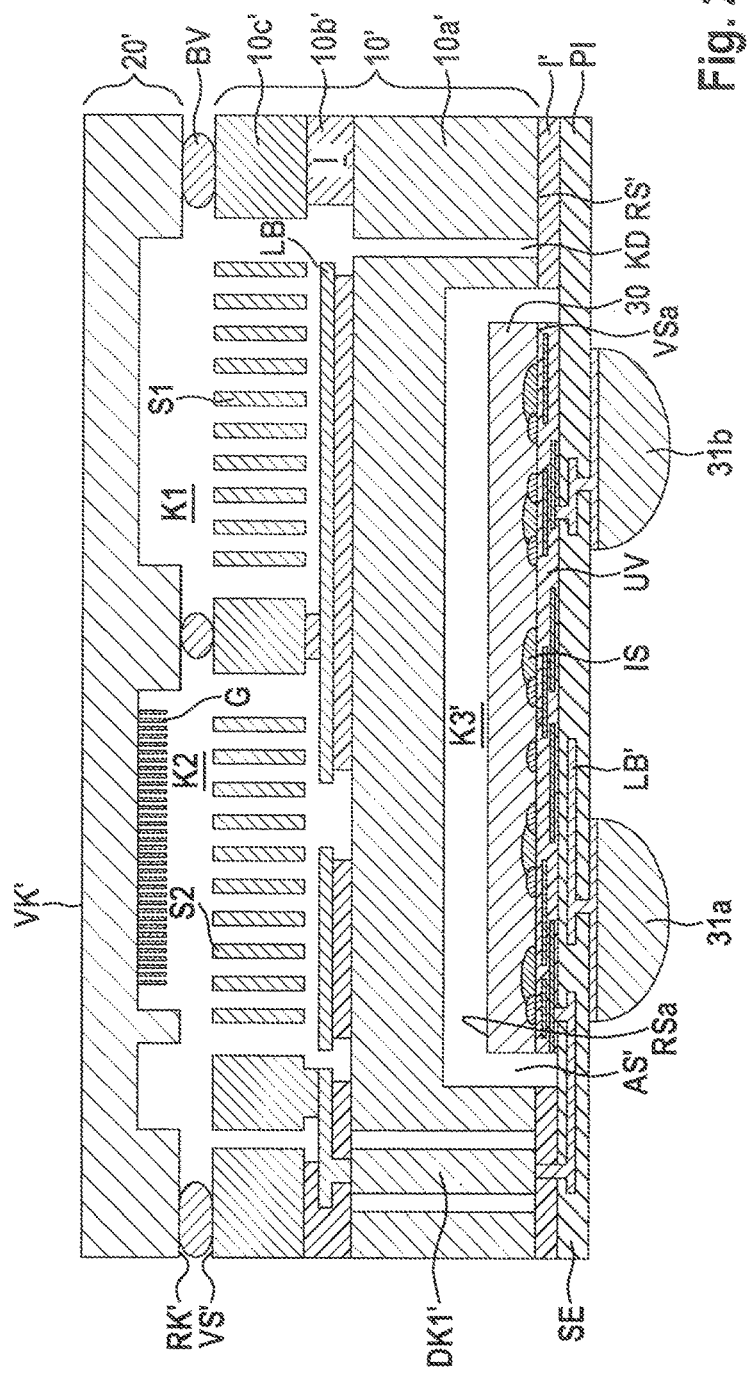
FIG. 2 shows a schematic cross-sectional view for explaining a micromechanical sensor device according to a second specific embodiment of the present invention.

FIG. 2 shows a schematic cross-sectional view for explaining a micromechanical sensor device according to a second specific embodiment of the present invention.

In the second specific embodiment, the recess is denoted by reference symbol AS', and is situated not in capping element 20' having third front side VK' and third rear side RK', but instead is situated in base substrate 10a' of MEMS substrate 10', having second front side VS' and second rear side RS' 10', on which second rewiring element 10b' and micromechanical functional layer 10c' are formed.

The suspension of ASIC substrate 30 in recess AS', forming cavity K3', thus takes place via insulating layer I', which is anchored on second rear side RS' via insulating layer I'.

In the present case, base substrate 10' includes a via DK1', through which the electrical signals from first rewiring element UV and second rewiring element 10b' are led to conductor element LB'.

In addition, base substrate 10a' includes a through hole KD, through which first cavity K1 is evacuatable before insulating layer I' is applied. Due to through hole KD, getter area G may optionally be dispensed with.

Otherwise, the suspension via first suspension element SE on second rear side RS' has an analogous design to the first specific embodiment described above.

Figure 3:
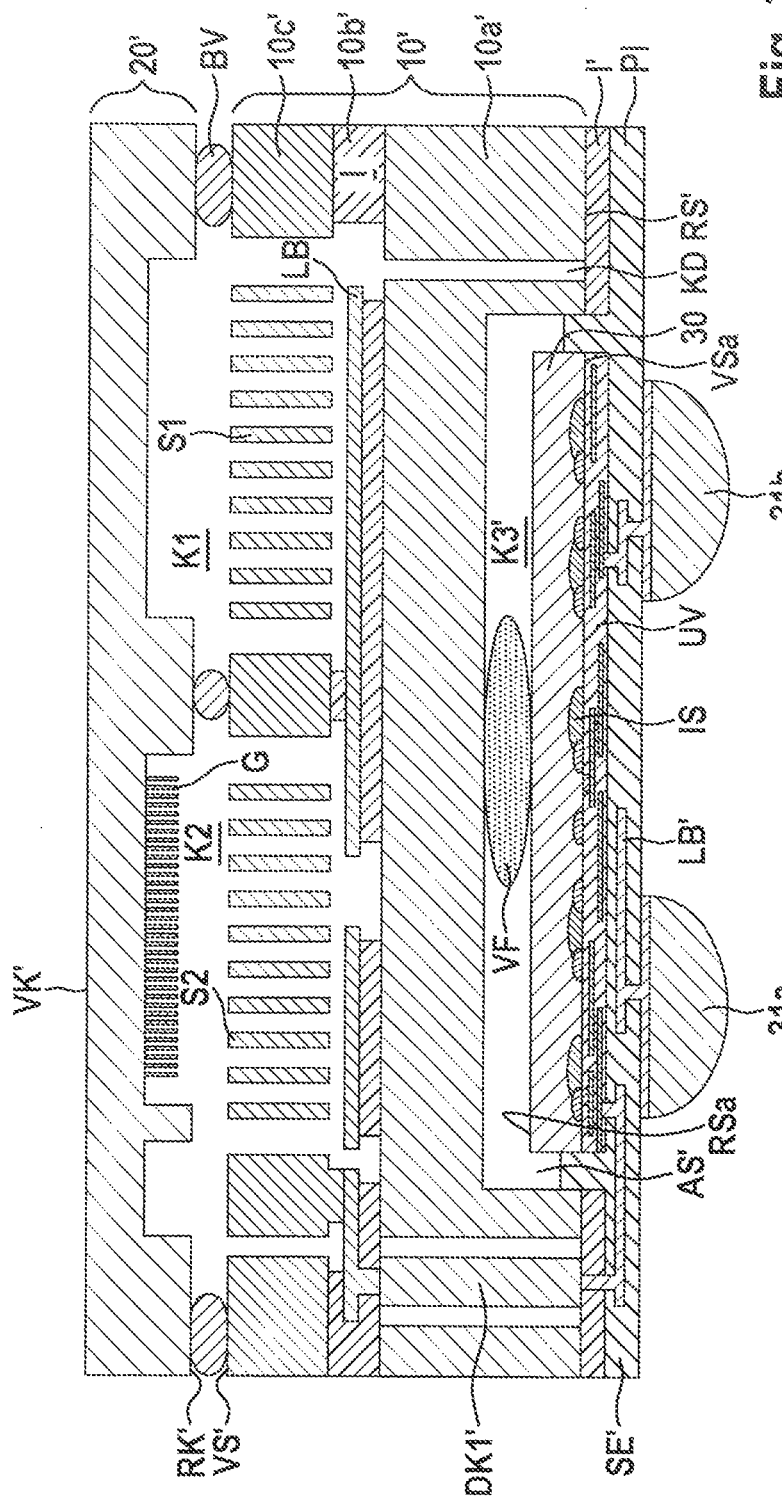
FIG. 3 shows a schematic cross-sectional view for explaining a micromechanical sensor device according to a third specific embodiment of the present invention.

FIG. 3 shows a schematic cross-sectional view for explaining a micromechanical sensor device according to a third specific embodiment of the present invention.

In the third specific embodiment, in contrast to the second specific embodiment described above, an island-shaped rigid or flexible adhesion area VF is additionally provided within cavity K3'.

As the result of the manufacture, in the third specific embodiment a polyimide layer PI of first suspension element protrudes at the side of ASIC substrate 30 and slightly into cavity K3'. However, this is not a problem, as explained in greater detail below.

FIGS. 4 through 7 show schematic cross-sectional views for explaining a manufacturing method for a micromechanical sensor device according to a fourth specific embodiment of the present invention.

Figure 4:
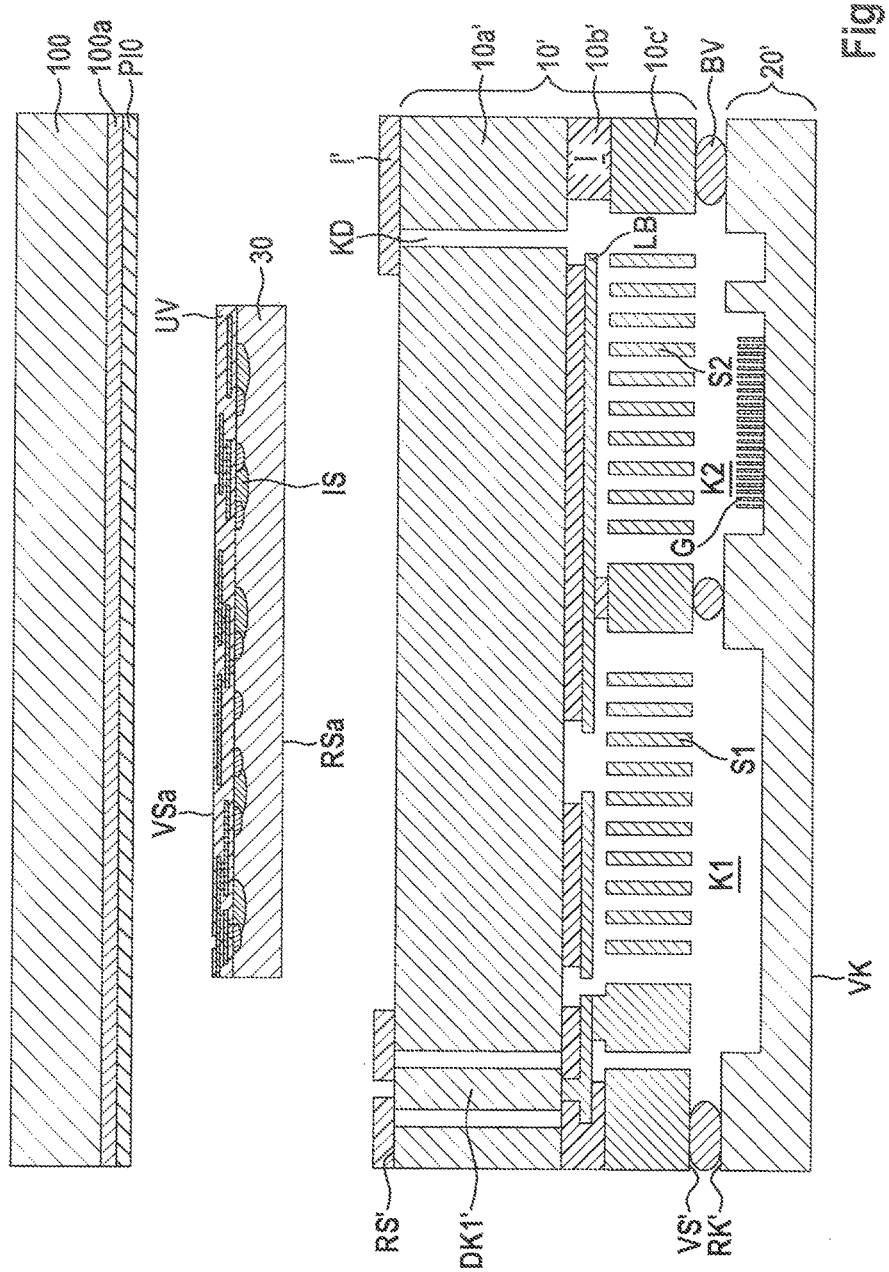
FIGS. 4 through 7 show schematic cross-sectional views for explaining a manufacturing method for a micromechanical sensor device according to a fourth specific embodiment of the present invention.

As illustrated in FIG. 4, initially a release layer 100a is applied to carrier substrate 100, and a first layer PI0, made of polyimide, of first suspension element SE is applied to release layer 100a.

ASIC substrate 30 is subsequently attached to first layer PI0 via first rewiring element UV.

MEMS substrate 10', which is capped with capping element 20', is subsequently provided, and recess AS' is formed in base substrate 10a' at second rear side RS'.

Figure 5:
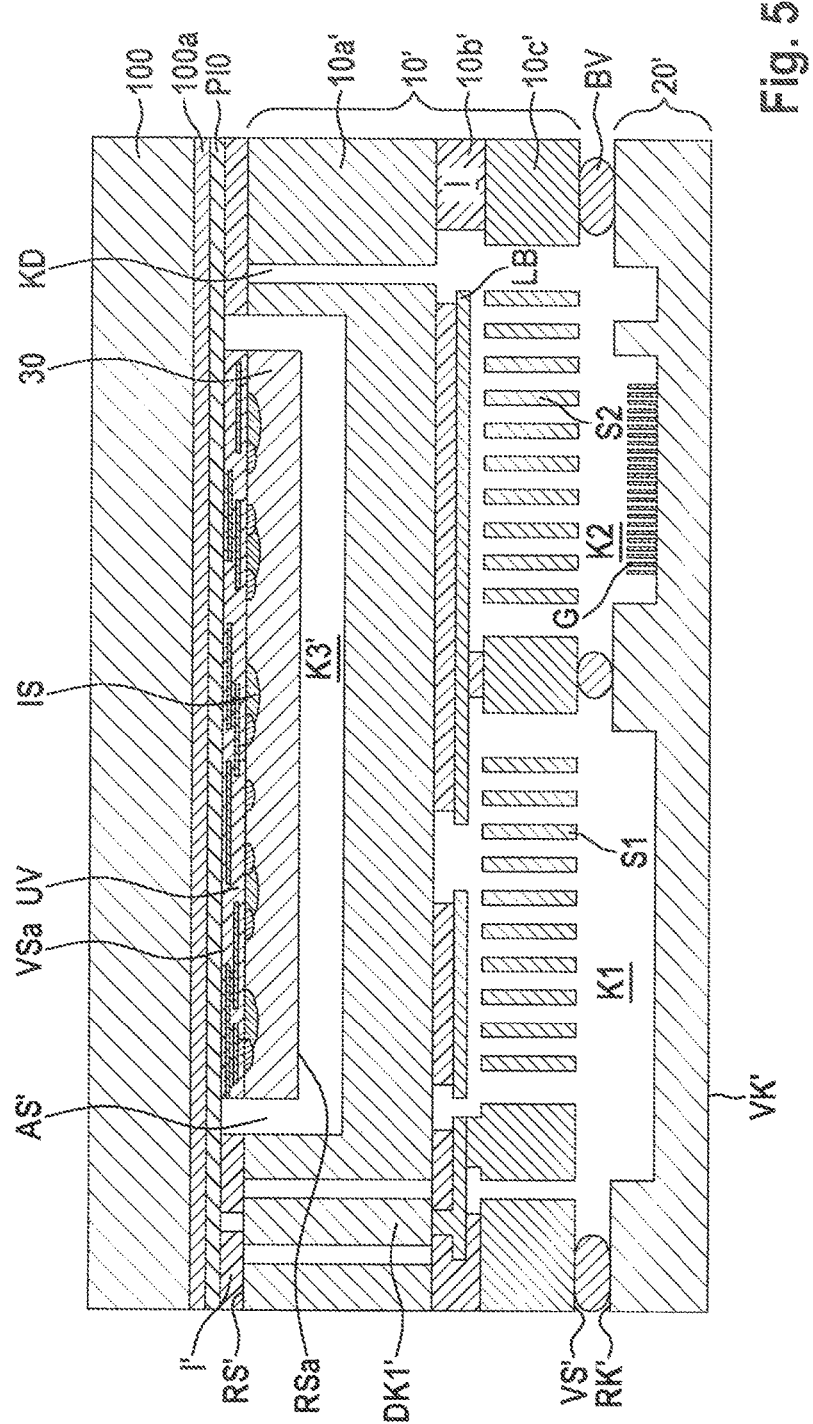
Figure 6:
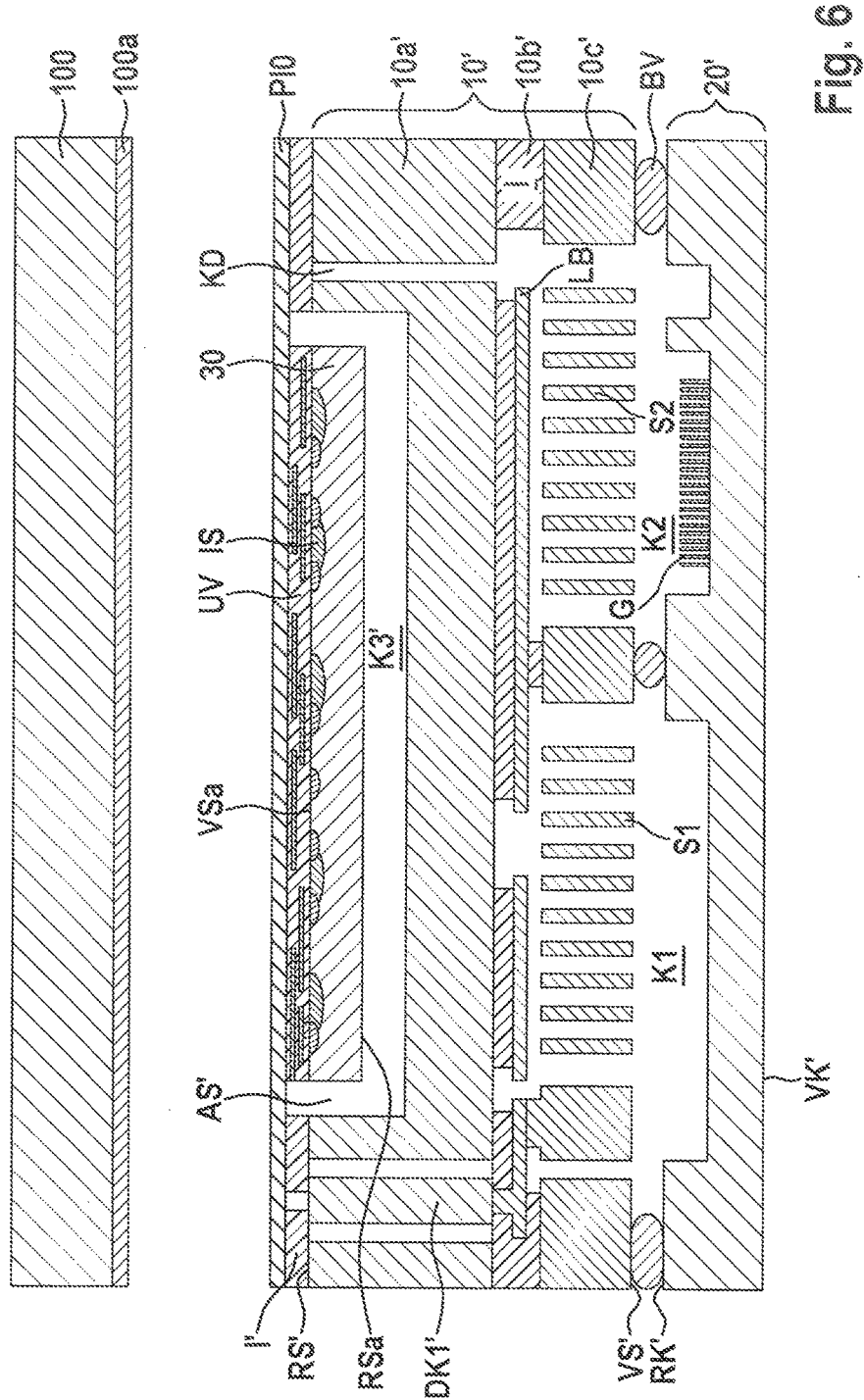

As illustrated in FIG. 5, carrier substrate 100 together with ASIC substrate 30 attached thereto is then attached to insulating layer I', ASIC substrate 30 being situated within recess AS', forming cavity K3'.

In a subsequent thermal step or illumination step, strong crosslinking and adhesion of first layer PI0, made of polyimide, to insulating layer I' and to first rewiring element UV is achieved.

Carrier substrate 100 may then be detached via a further thermal step or illumination step by disintegrating release layer 100a. This results in the process state according to FIG. 6.

Figure 7:
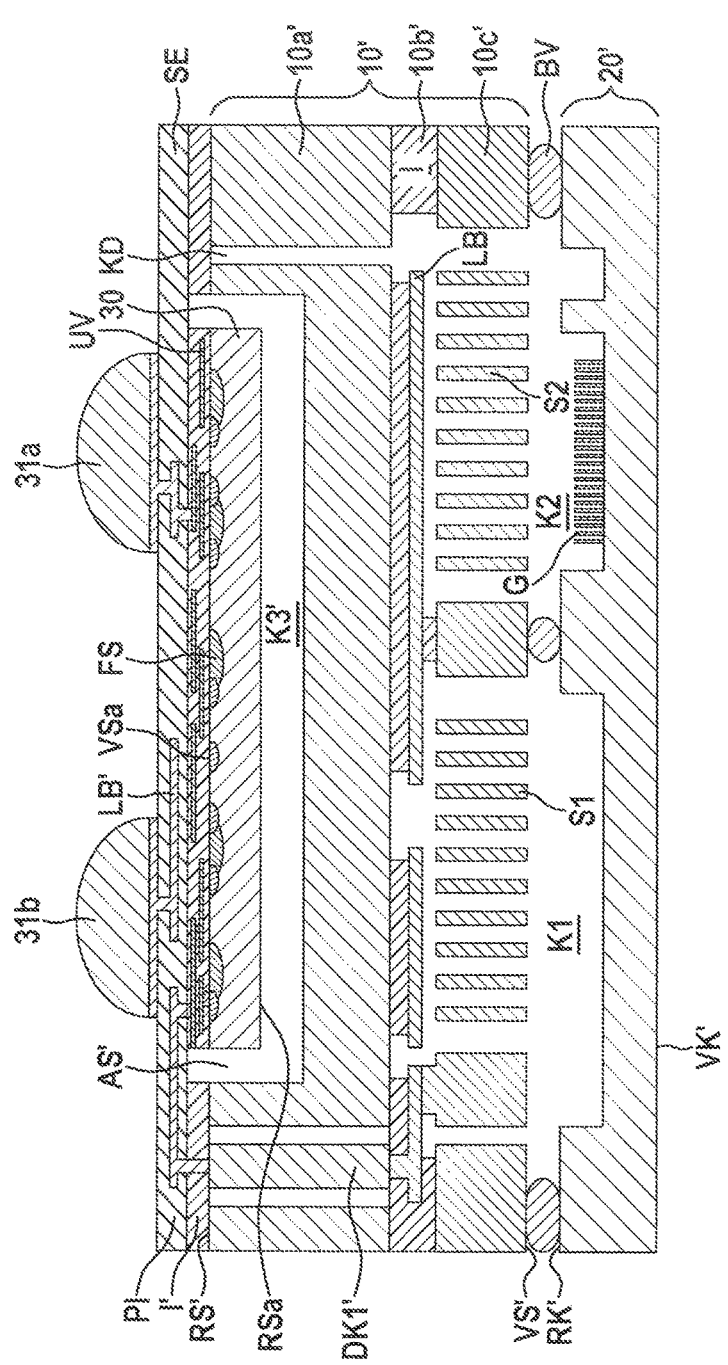

With further reference to FIG. 7, contact holes are then provided in first layer PI0, and conductors of conductor element LB' are then deposited in alternation with further polyimide layers PI. Lastly, solder balls 31a, 31b are applied to the uppermost conductors of conductor element LB'.

The overall thickness of first suspension element SE, and thus the desired degree of flexibility, may be set via the number or thickness of polyimide layers PI.

The above-described manufacturing process has been described with reference to a single component. In practice, however, this manufacturing process usually takes place on the wafer level, a plurality of identical components being manufactured in parallel, and a separation process, for example a sawing process, taking place after the process state according to FIG. 7.

FIGS. 8 through 11 show schematic cross-sectional views for explaining a manufacturing method for a micromechanical sensor device according to a fifth specific embodiment of the present invention.

Figure 8:
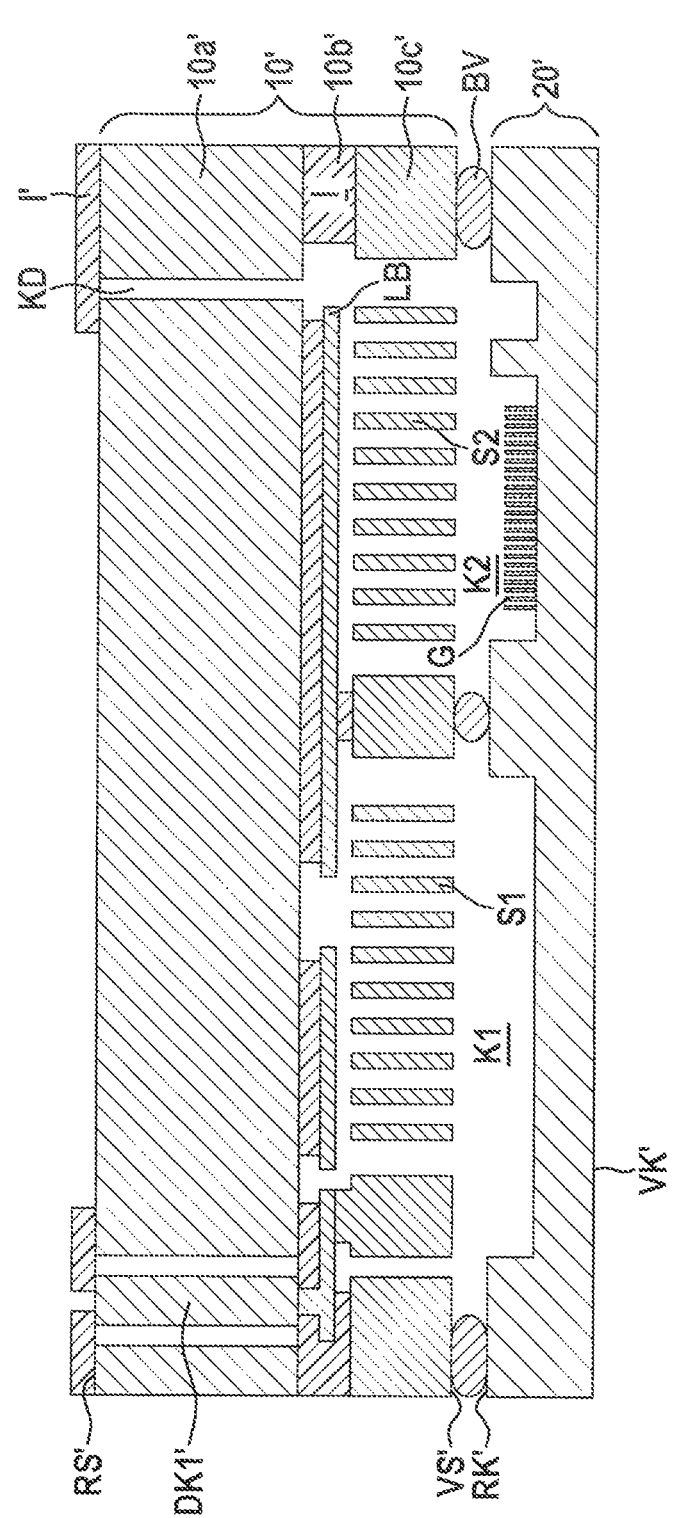
FIGS. 8 through 11 show schematic cross-sectional views for explaining a manufacturing method for a micromechanical sensor device according to a fifth specific embodiment of the present invention.
Figure 9:
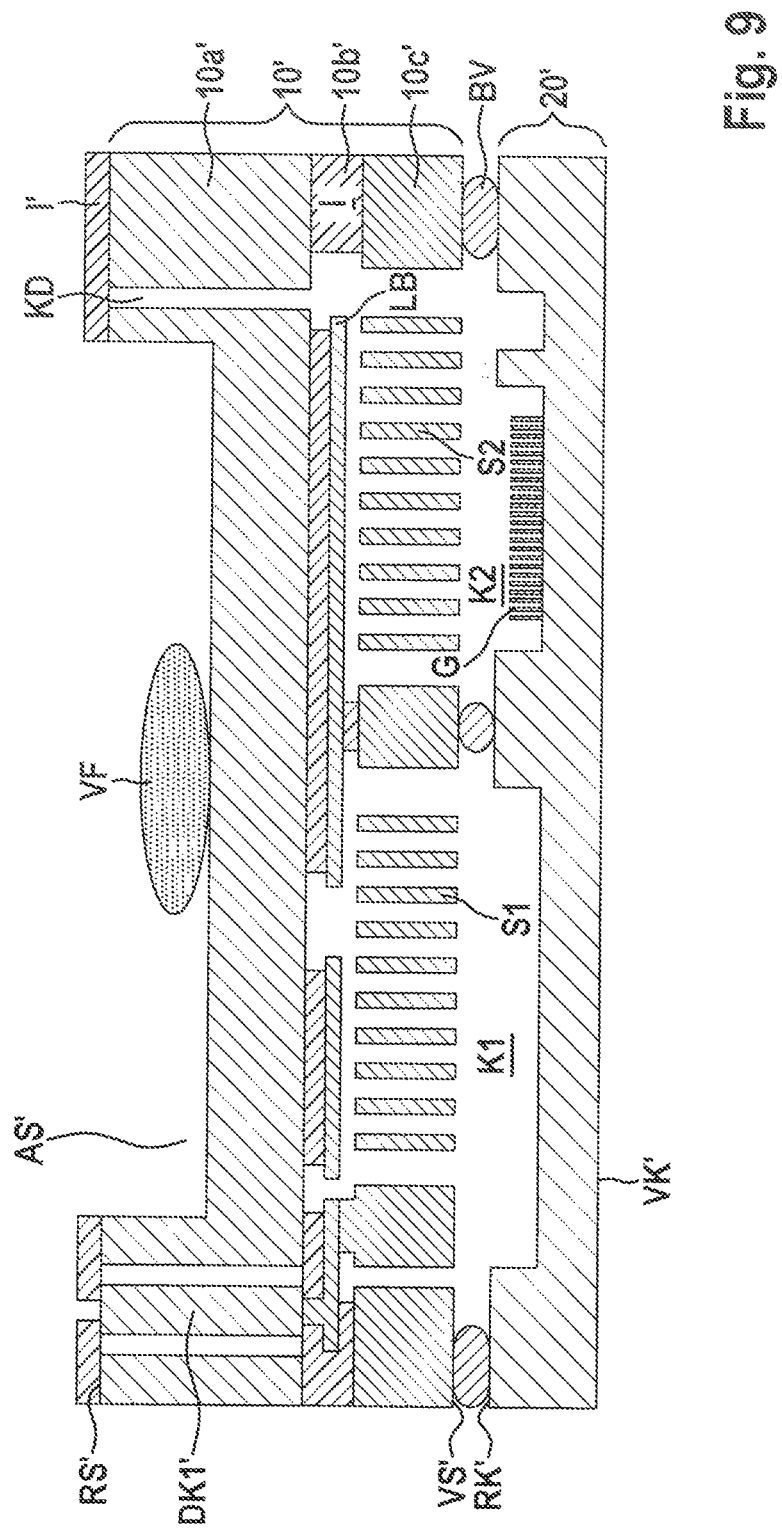

In the fifth specific embodiment, initially MEMS substrate 10', which is capped with capping element 20', is provided, as shown in FIG. 8.

Recess AS' is subsequently formed on second rear side RS', and an island-shaped rigid or flexible adhesion area VS is provided therein. This results in the process state according to FIG. 9.

Figure 10:
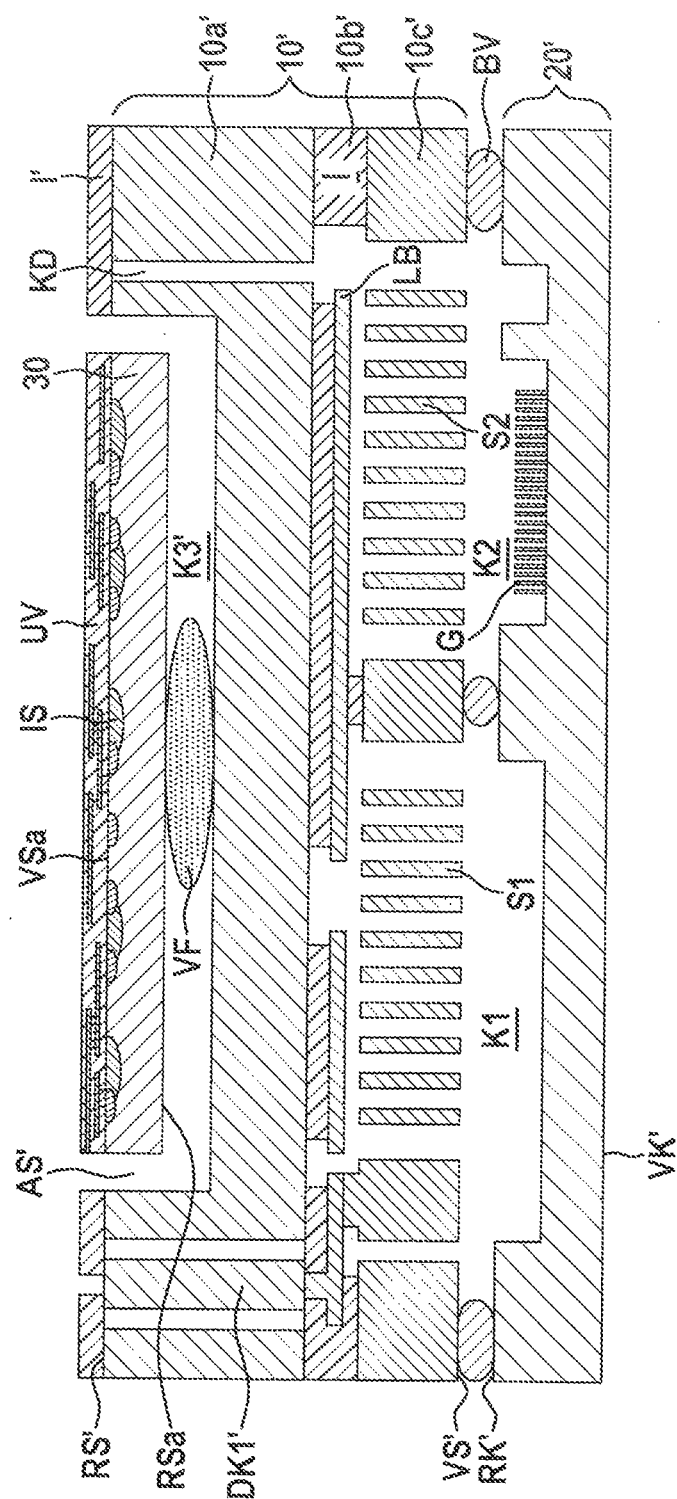

As illustrated in FIG. 10, ASIC substrate 30 is subsequently pressed into recess AS', forming cavity K3'. First front side VSa, as already mentioned above, is then situated in flush alignment in a plane with second rear side RS', and insulating layer I' is situated in flush alignment in a plane with rewiring element UV.

Figure 11:
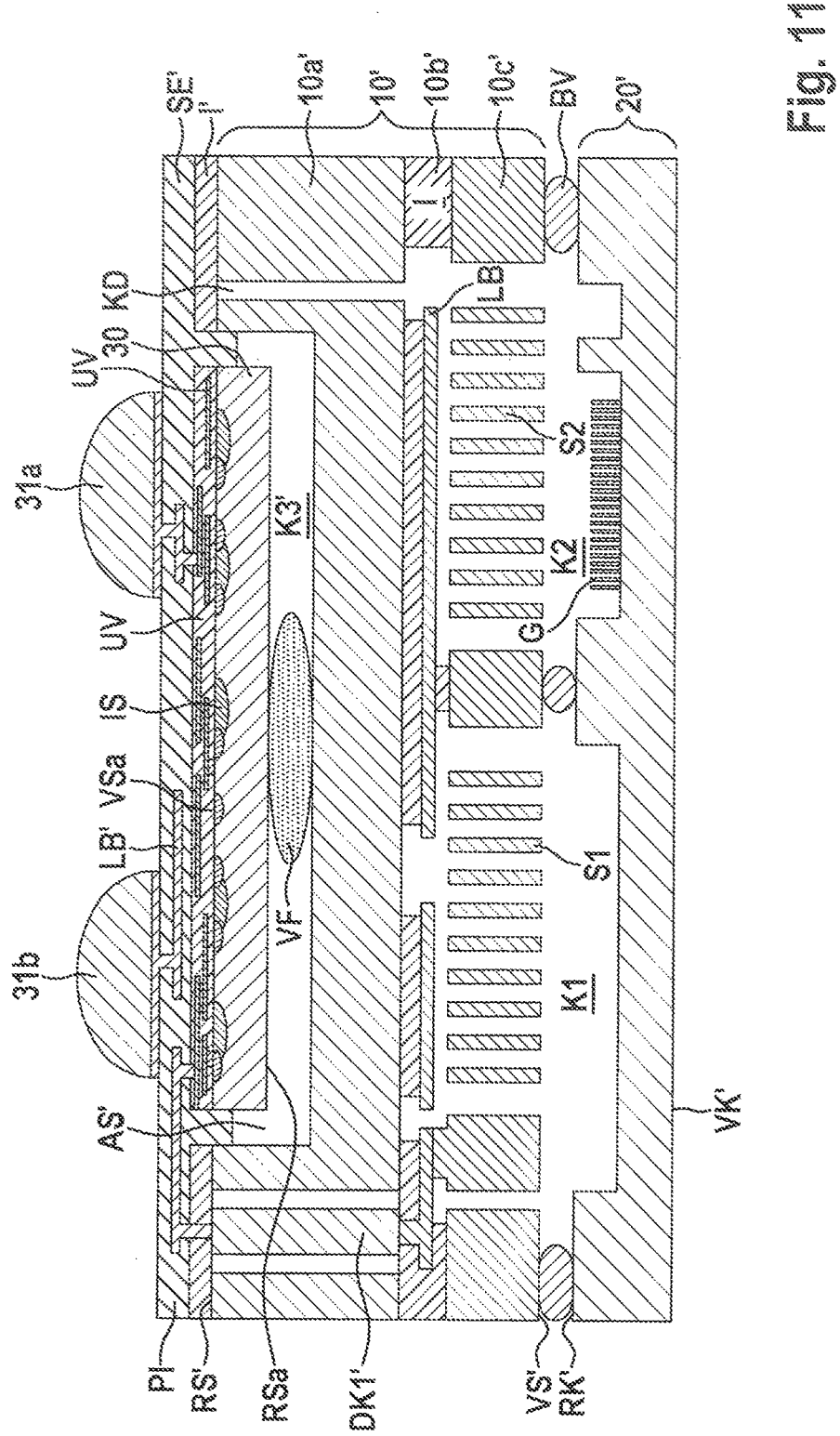

With further reference to FIG. 11, initially first layer PI0 of first suspension element SE' is deposited, and conductor element LB', subsequently embedded in further polyimide layers PI, is completed, after which solder balls 31a, 31b are applied.

As the result of first layer PI0 of polyimide layer being applied in the process state according to FIG. 11, this first layer protrudes at the sides of ASIC substrate 30 in the manner of a plug, and slightly into cavity K3', which, however, does not impair the flexibility of first suspension element SE'.

Although the present invention has been described with reference to the exemplary embodiments, it is not limited thereto. In particular, the mentioned materials and topologies are solely examples, and are not limited to the described examples.

Although the micromechanical sensor device has been described as a bare die system in the specific embodiments described above, the micromechanical sensor device may also be packaged as a particularly small molded package if this is necessary based on the application.

Although polyimide has been used as a flexible layer material for the suspension element in the above specific embodiments, it is also possible to use other elastic materials, in particular elastic plastics, for this purpose.

Of course, even further or different micromechanical sensor structures may be provided in the MEMS substrate.

In addition, multiple island-shaped rigid or flexible adhesion areas may be provided within the cavity surrounding the ASIC substrate.

What is claimed is:

1. A micromechanical sensor device, comprising:
an ASIC substrate having a first front side and a first rear side, a first rewiring element being formed on the first front side;
a MEMS substrate having a second front side, and a second rear side having a base substrate and a second rewiring element formed thereon;
a micromechanical functional layer in which at least one movable sensor structure is formed, and which is formed on the second front side of the second rewiring element;
a capping element having a third front side and a third rear side, wherein the third rear side is applied to the second front side for capping the sensor structure; and
a recess formed in both the base substrate on the second rear side and in the capping element on the third front side, and within which the ASIC substrate is suspended on a flexible layered first suspension element via the first rewiring element, forming a cavity which surrounds the ASIC substrate.

2. The micromechanical sensor device of claim 1, wherein the recess is in the base substrate and the first suspension element is anchored on the second rear side.

3. The micromechanical sensor device of claim 1, wherein the recess is formed in the capping element and the first suspension element is anchored on the third front side.

4. The micromechanical sensor device of claim 1, wherein a second suspension element is formed in the cavity.

5. The micromechanical sensor device of claim 4, wherein the second suspension element has at least one island-shaped rigid or flexible adhesion area.

6. The micromechanical sensor device of claim 1, wherein bond connections for electrically connecting the sensor device are formed on the first suspension element in the area of the first front side.

7. The micromechanical sensor device of claim 1, wherein the first suspension element includes multiple flexible layers, which include polyimide layers, and a conductor element embedded therein which is electrically connected to the first rewiring element.

8. A micromechanical sensor device, comprising:
an ASIC substrate having a first front side and a first rear side, a first rewiring element being formed on the first front side;
a MEMS substrate having a second front side, and a second rear side having a base substrate and a second rewiring element formed thereon;
a micromechanical functional layer in which at least one movable sensor structure is formed, and which is formed on the second front side of the second rewiring element;
a capping element having a third front side and a third rear side, wherein the third rear side is applied to the second front side for capping the sensor structure; and
a recess formed in the base substrate on the second rear side, or in the capping element on the third front side, and within which the ASIC substrate is suspended on a flexible layered first suspension element via the first rewiring element, forming a cavity which surrounds the ASIC substrate,
wherein the first suspension element includes multiple flexible layers, and a conductor element embedded therein which is electrically connected to the first rewiring element.

9. The micromechanical sensor device of claim 8, wherein the conductor element has a meandering configuration in a peripheral area of the ASIC substrate.

10. The micromechanical sensor device of claim 8, wherein the conductor element is electrically connected to the micromechanical functional layer through a via formed in the base substrate or in the capping element.

11. A micromechanical sensor device, comprising:
an ASIC substrate having a first front side and a first rear side, a first rewiring element being formed on the first front side;
a MEMS substrate having a second front side, and a second rear side having a base substrate and a second rewiring element formed thereon;
a micromechanical functional layer in which at least one movable sensor structure is formed, and which is formed on the second front side of the second rewiring element;
a capping element having a third front side and a third rear side, wherein the third rear side is applied to the second front side for capping the sensor structure; and
a recess formed in the base substrate on the second rear side, or in the capping element on the third front side, and within which the ASIC substrate is suspended on a flexible layered first suspension element via the first rewiring element, forming a cavity which surrounds the ASIC substrate,
wherein the recess is in the base substrate and the first suspension element is anchored on the second rear side,
wherein the first suspension element is anchored, via an insulating layer, on the second rear side, which closes off a through opening which leads to an additional cavity in which the movable sensor structure is formed.

* * * * *